(12) United States Patent
Shirai et al.

(10) Patent No.: US 12,191,777 B2
(45) Date of Patent: Jan. 7, 2025

(54) POWER CONVERSION DEVICE

(71) Applicant: Hitachi Astemo, Ltd., Hitachinaka (JP)

(72) Inventors: Takayuki Shirai, Shioya-gun (JP); Takuya Yagi, Oyama (JP); Shinichiro Hayakawa, Utsunomiya (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 301 days.

(21) Appl. No.: 17/749,798

(22) Filed: May 20, 2022

(65) Prior Publication Data

US 2022/0385202 A1  Dec. 1, 2022

(30) Foreign Application Priority Data

May 31, 2021  (JP) .................. 2021-090824

(51) Int. Cl.
*H02M 7/00* (2006.01)
*G01R 33/07* (2006.01)
*H02M 7/48* (2007.01)
*H05K 7/14* (2006.01)

(52) U.S. Cl.
CPC ............ *H02M 7/003* (2013.01); *G01R 33/07* (2013.01); *H02M 7/48* (2013.01); *H05K 7/1432* (2013.01)

(58) Field of Classification Search
CPC ........ H02M 7/003; H02M 7/48; H02M 3/003; H02M 1/0009; G01R 15/202; G01R 15/207; H05K 7/1432; H05K 7/14329; H05K 7/14322
See application file for complete search history.

(56) References Cited

U.S. PATENT DOCUMENTS

| | | | | |
|---|---|---|---|---|
| 2008/0079524 | A1* | 4/2008 | Suzuki | H01F 27/22 336/61 |
| 2013/0075886 | A1* | 3/2013 | Abe | H02M 7/003 257/E25.027 |
| 2013/0182478 | A1* | 7/2013 | Nomura | H02M 7/42 336/61 |
| 2013/0265808 | A1* | 10/2013 | Ishii | H02M 1/12 363/97 |
| 2014/0184212 | A1* | 7/2014 | Yamaguchi | G01R 15/207 324/244 |
| 2017/0343586 | A1* | 11/2017 | Oka | G01R 15/183 |
| 2018/0348261 | A1* | 12/2018 | Okamoto | G01R 15/207 |
| 2019/0230812 | A1* | 7/2019 | Shintani | H01R 9/24 |
| 2019/0260293 | A1* | 8/2019 | Kurokawa | H02M 3/158 |
| 2020/0294708 | A1* | 9/2020 | Ishizawa | H05K 1/165 |

FOREIGN PATENT DOCUMENTS

JP  2017184384 A  10/2017

\* cited by examiner

*Primary Examiner* — Adam B Dravininkas
(74) *Attorney, Agent, or Firm* — CANTOR COLBURN LLP (57) ABSTRACT

This power conversion device includes a magnetic core which has a gap formed by cutting out a part of an annular shape, a resin primary molded body configured to hold the magnetic core by covering a first end portion and a second end portion of the magnetic core that are arranged opposite to each other with the gap therebetween from outside of the magnetic core in a radial direction, and a resin secondary molded body which has an exposed portion in which a surface of a portion of the primary molded body that covers the first end portion and the second end portion is exposed, and contains the primary molded body.

6 Claims, 5 Drawing Sheets

POWER CONVERSION DEVICE

CROSS REFERENCE TO RELATED APPLICATIONS

The present invention claims priority under 35 U.S.C. § 119 to Japanese Application No. 2021-090824 filed on May 31, 2021, the entire contents of which being incorporated herein by reference.

BACKGROUND OF THE INVENTION

Field of the Invention

The present invention relates to a power conversion device.

Description of Related Art

In vehicles such as electric vehicles, a power conversion device (PCU: Power Control Unit) is provided between a battery and a motor. Such a power conversion device includes a plurality of semiconductor power chips and a power module case that accommodates these power chips. The power module case contains a bus bar that serves as a transmission path.

Japanese Unexamined Patent Application, First Publication No. 2017-184384 discloses a power conversion device that includes a current sensor for detecting a current flowing through such a bus bar.

Incidentally, the current sensor as described above has a magnetic core. The magnetic core is formed in a C-type annual shape provided with a gap for disposing a Hall element therein. When a power conversion device is manufactured, for example, it is conceivable to perform insert molding in which the magnetic core is held by a resin primary molded body, and a resin secondary molded body is formed to contain the primary molded body holding the magnetic core. However, there is a problem that a gap distance of the magnetic core may change due to a pressure received from a molten resin when injection molding is performed on the secondary molded body. If the gap distance of the magnetic core changes with respect to a design value, the measurement performance of a current sensor may deteriorate.

The present invention has been made in view of the problems described above, and, in a power conversion device having a magnetic core provided with a gap, aims to prevent the gap of the magnetic core from changing due to a resin pressure at the time of forming a secondary molded body.

SUMMARY OF THE INVENTION

The present invention has adopted the following configuration to solve the problems described above.

A first aspect adopts a configuration in which a power conversion device includes a magnetic core which has a gap formed by cutting out a part of an annular shape, a resin primary molded body configured to hold the magnetic core by covering a first end portion and a second end portion of the magnetic core that are arranged opposite to each other with the gap therebetween from outside of the magnetic core in a radial direction, and a resin secondary molded body which has an exposed portion in which a surface of a portion of the primary molded body that covers the first end portion and the second end portion is exposed, and contains the primary molded body.

A second aspect adopts a configuration in which, in the first aspect described above, the primary molded body has a groove portion in which a first end surface exposed to the gap of the first end portion and a second end surface exposed to the gap of the second end portion are exposed.

A third aspect adopts a configuration in which, in the second aspect described above, the secondary molded body has a fitting wall portion from an inner wall surface on the first end surface side of the groove portion to an inner wall surface on the second end surface side with the first end surface and the second end surface exposed.

A fourth aspect adopts a configuration in which, in the second or third aspect described above, the secondary molded body has a claw portion that is locked from the outside of the magnetic core in the radial direction to an inside in the radial direction on a surface of the primary molded body.

A fifth aspect adopts a configuration in which, in any one of the first to fourth aspects described above, the power conversion device further includes a fastening structure in which an end portion of a bus bar inserted into the inside of the magnetic core in the radial direction is fastened, and the fastening structure is held in the primary molded body and arranged adjacent to the magnetic core.

The power conversion device according to each of the aspects of the present invention described above has a portion in which a primary molded body covers a first end portion and a second end portion of a magnetic core from outside of the magnetic core in a radial direction. In addition, a secondary molded body has an exposed portion in which the secondary molded body that contains the primary molded body exposes a surface of the portion. For this reason, according to each of the aspects of the present invention described above, when the secondary molded body is formed, a molten resin does not hit a portion of the primary molded body that covers the first end portion and the second end portion. Therefore, it is possible to prevent a pressure due to a molten resin from acting on the first end portion and the second end portion of the magnetic core and to prevent a gap provided between the first end portion and the second end portion from being deformed. Therefore, according to each of the aspects of the present invention described above, in a power conversion device having a magnetic core provided with a gap, it is possible to prevent a gap from changing due to a resin pressure at the time of forming the secondary molded body.

DETAILED DESCRIPTION OF THE INVENTION

Hereinafter, an embodiment of a power conversion device according to the present invention will be described with reference to the drawings.

First Embodiment

Figure 1:
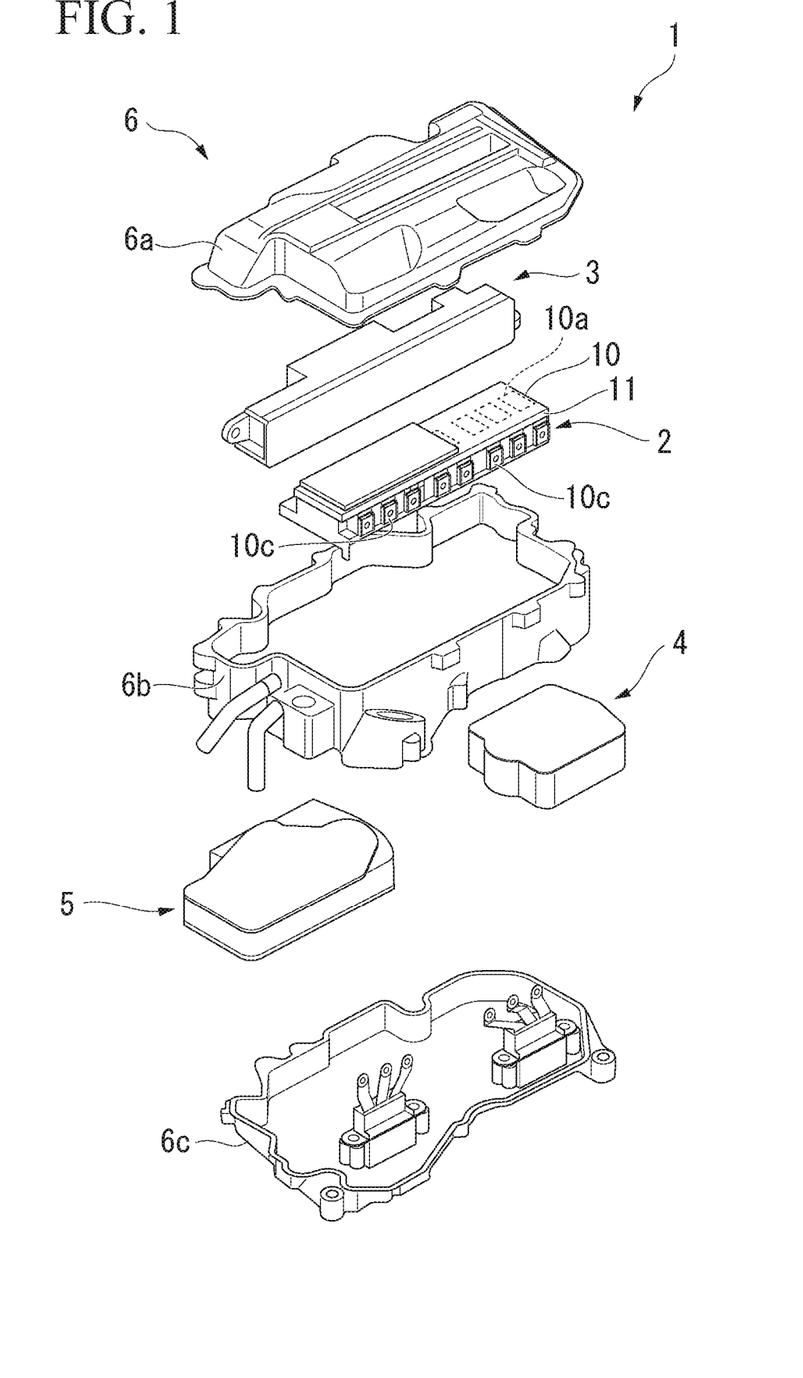
FIG. 1 is an exploded perspective view which shows a schematic configuration of a power conversion device in a first embodiment of the present invention.

FIG. 1 is an exploded perspective view which shows a schematic configuration of a power conversion device 1 of the present embodiment. The power conversion device 1 is mounted in a vehicle such as an electric vehicle and is provided between a battery and a motor (a load) (not shown). As shown in FIG. 1, the power conversion device 1 includes an intelligent power module 2, a capacitor 3, a reactor 4, a DCDC converter 5, and a main body case 6.

The intelligent power module 2 includes a power module 10, a circuit board 11, and the like. The power module 10 includes a plurality of power devices 10a having power semiconductor elements, a resin power module case 10b for accommodating these power devices 10a, and a bus bar 10c connected to the power device 10a. In addition, the power module 10 includes a water jacket for cooling, and the like. This power module 10 will be described in more detail below.

A circuit board 11 is a substrate provided with a step-up/step-down converter formed by the power device 10a, a gate driver that generates a drive signal of an inverter, an electronic control unit (ECU) that controls a gate driver, and the like. The circuit board 11 is laminated onto the power module 10. A plurality of hall elements (not shown), which are a part of a current sensor for measuring a current flowing through the bus bar 10c, are mounted on the circuit board 11. The hall elements are arranged in a gap G of a magnetic core 30 to be described below, which is held by the power module case 10b.

The capacitor 3 is connected to the intelligent power module 2 and is arranged on a side of the power module 10. The reactor 4 of the present embodiment is arranged below the intelligent power module 2. A configuration of the reactor 4 of the present embodiment will be described in detail below. The DCDC converter 5 is arranged on a side of the reactor 4 and below the intelligent power module 2. The DCDC converter 5 converts a battery power into a voltage suitable for surrounding electronic components (electronic components mounted on the circuit board 11, and the like).

The main body case 6 is a case that accommodates the intelligent power module 2, the capacitor 3, the reactor 4, and the DCDC converter 5, and includes an upper case 6a, a central case 6b, and a lower case 6c. The upper case 6a, the central case 6b and the lower case 6c are divisibly connected in the lamination direction of the power module 10 and the circuit board 11. The upper case 6a covers the intelligent power module 2 from the circuit board 11 side and is fastened to the central case 6b. The central case 6b covers the surroundings of the intelligent power module 2, the capacitor 3, the reactor 4, and the DCDC converter 5. The lower case 6c covers the reactor 4 and the DCDC converter 5 from below, is provided with a connector for connecting the intelligent power module 2 and the motor (not shown) and is fastened to the central case 6b.

Figure 2:
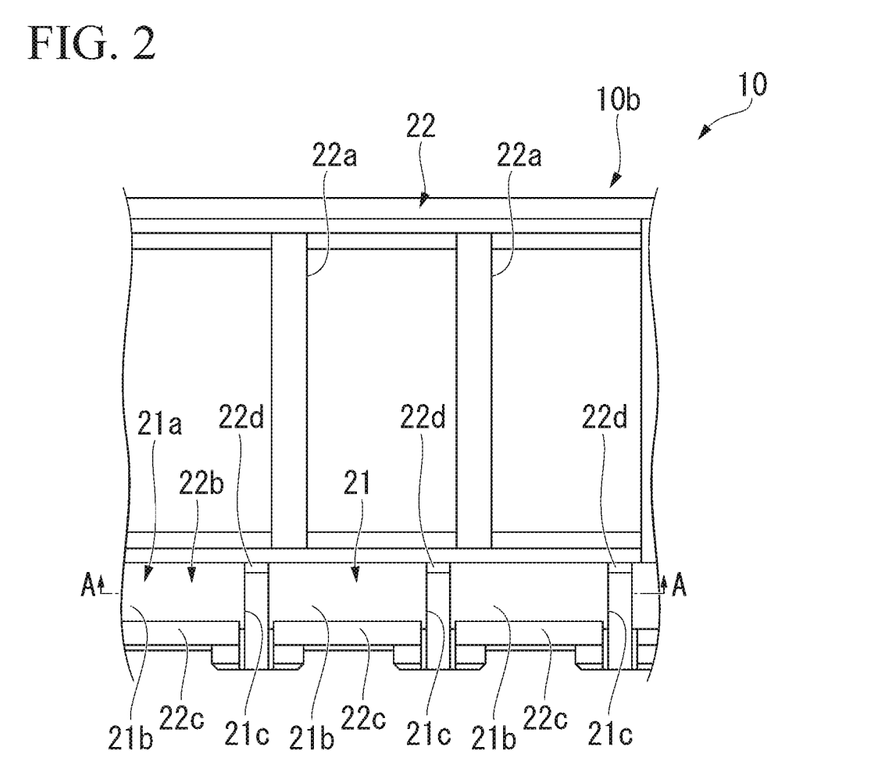
FIG. 2 is a plan view which shows a part of a power module included in the power conversion device in the first embodiment of the present invention.
Figure 3:
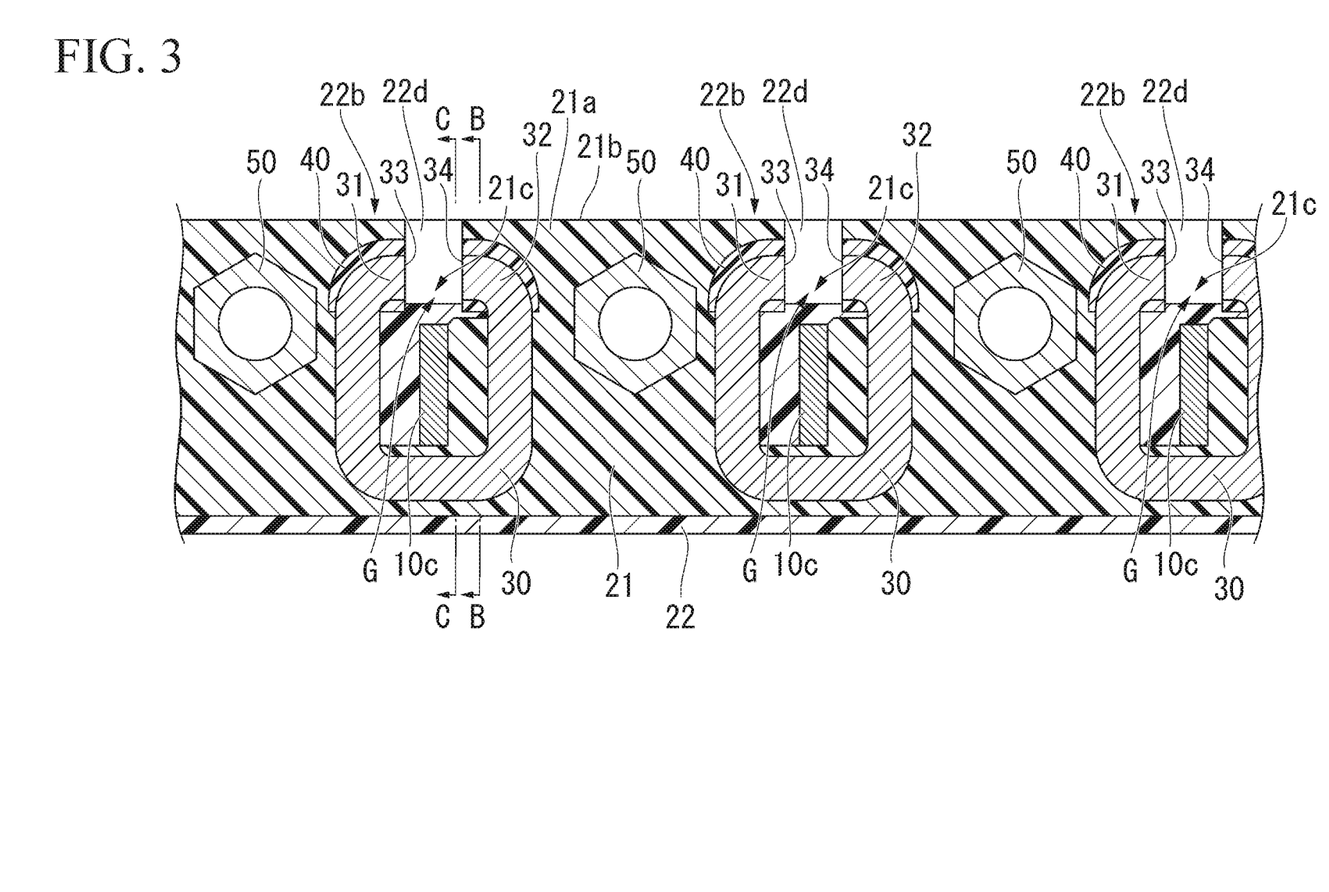
FIG. 3 is a diagram which shows a part of the power module and is a sectional view taken along the line A-A of FIG. 2.
Figure 4A:
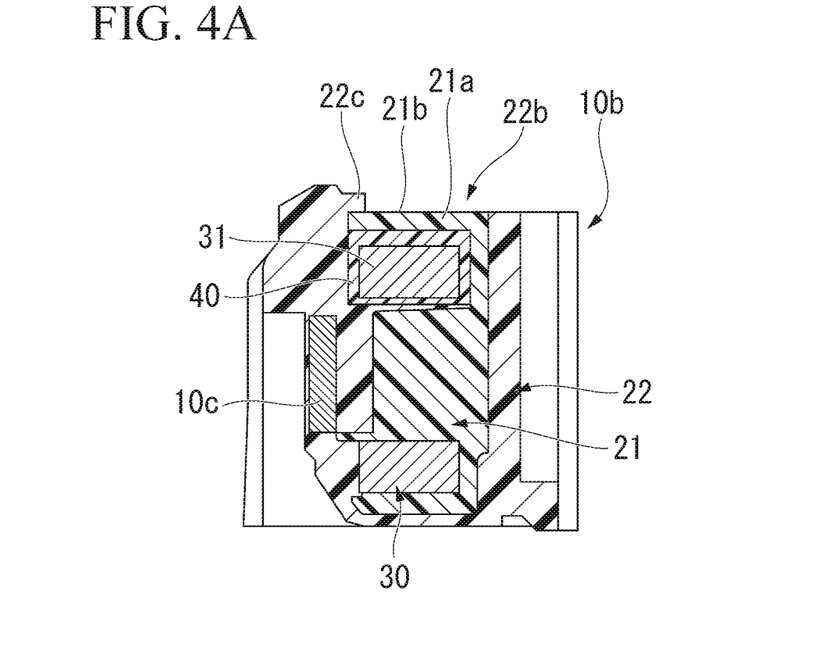
FIG. 4A is a diagram which shows a part of the power module and is a sectional view taken along the line B-B of FIG. 3.
Figure 4B:
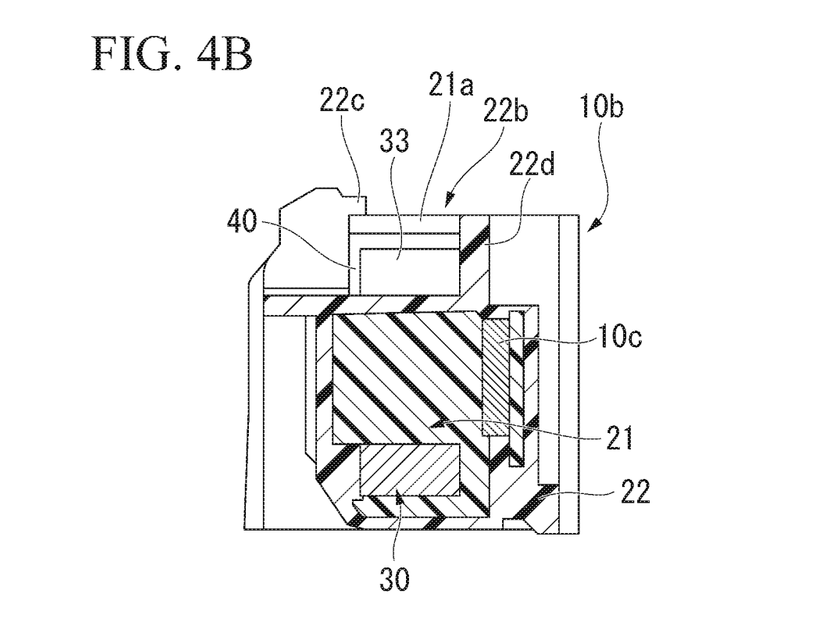
FIG. 4B is a diagram which shows a part of the power module and is a sectional view taken along the line C-C of FIG. 3.

Next, the power module 10 will be described in more detail. FIG. 2 is a plan view which shows a part of the power module 10. In FIG. 2, the bus bar 10c of the power module 10 is omitted. In addition, FIG. 3 is a cross-sectional view taken along the A-A of FIG. 2. Moreover, FIG. 4A is a cross-sectional view taken along the B-B of FIG. 3, and FIG. 4B is a cross-sectional view taken along the C-C of FIG. 3.

As shown in these drawings, the power module case 10b of the power module 10 includes a primary molded body 21 and a secondary molded body 22. The primary molded body 21 is a molded body formed of a resin, and holds, for example, a magnetic core 30, a reinforcing resin portion 40, and a fastening nut 50 (a fastening structure), as shown in FIG. 3.

Here, the magnetic core 30 is an annular member formed of a magnetic material. More specifically, as shown in FIG. 3, the magnetic core 30 is formed in a C shape having a gap G formed by cutting out a part of the annular shape. This magnetic core 30 forms a part of a current sensor together with hall elements (not shown) arranged in the gap G.

In the magnetic core 30, the gap G is provided so as to penetrate the magnetic core 30 in the radial direction. In addition, the magnetic core 30 is formed in a shape having a first end portion 31 and a second end portion 32 arranged opposite to each other with the gap G therebetween. A surface of the first end portion 31 facing the gap G is referred to as a first end surface 33, and a surface of the second end portion 32 facing the gap G is referred to as a second end surface 34. That is, the magnetic core 30 is formed in an annular shape in which the gap G is provided between the first end surface 33 of the first end portion 31 and the second end surface 34 of the second end portion 32.

A plurality of magnetic cores 30 are provided to be arranged for each bus bar 10c. Each of the magnetic cores 30 is arranged so that the gap G faces the circuit board 11 side when viewed in a direction along an axis of the annular shape (a direction perpendicular to a paper surface in FIG. 3).

The reinforcing resin portion 40 is a resin member having a higher rigidity than the primary molded body 21 and is provided in each of the first end portion 31 and the second end portion 32 of the magnetic core 30. The reinforcing resin portion 40 provided for the first end portion 31 is provided to cover the first end portion 31 with the first end surface 33 exposed. The reinforcing resin portion 40 provided for the second end portion 32 is provided to cover the second end portion 32 with the second end surface 34 exposed.

As shown in FIG. 3, the fastening nut 50 is arranged adjacent to a side of the magnetic core 30. A plurality of fastening nuts 50 are provided to be arranged for each magnetic core 30 (that is, each bus bar 10c). End portions of the bus bars 10c are fastened to these fastening nuts 50 by bolts (not shown). Each fastening nut 50 is a metal nut having higher rigidity than the primary molded body 21 and the secondary molded body 22.

As shown in FIG. 3, the primary molded body 21 holds the magnetic core 30 to cover it in the radial direction. The primary molded body 21 has an upper wall portion 21a that covers the first end portion 31 and the second end portion 32 of the magnetic core 30 from the outside in the radial direction. This upper wall portion 21a is a portion that covers the first end portion 31 and the second end portion 32 of the primary molded body 21. An outer wall surface 21b of the upper wall portion 21a is directed toward the circuit board 11 side and is formed to be flat. This outer wall surface 21b of the upper wall portion 21a is an exposed surface whose range is mostly not covered by the secondary molded body 22.

In addition, the upper wall portion 21a of the primary molded body 21 has a plurality of groove portions 21c provided in accordance with the gap G of the magnetic core 30. These groove portions 21c are formed at a depth reaching the gap G from the outer wall surface 21b and expose the first end surface 33 and the second end surface 34 of the magnetic core 30. A hall element (not shown) mounted on the circuit board 11 is inserted into each of these groove portions 21c.

Moreover, the primary molded body 21 is provided with a plurality of pads to which the power device 10a is connected and conductive members (not shown) such as connection pins for connecting the pads to the circuit board 11. The primary molded body 21 is included in the secondary molded body 22 and is provided integrally with the secondary molded body 22. The primary molded body 21 is formed by injection molding in which a molten resin is injected into a mold and cooled. For example, a primary molded body 21 having recesses for fitting the magnetic core 30, the reinforcing resin portion 40, and the fastening nut 50 is formed by injection molding, and the magnetic core 30, the reinforcing resin portion 40, and the fastening nut 50 are fit into these recesses after molding.

The secondary molded body 22 is a resin molded body containing the primary molded body 21 and has a plurality of accommodation recesses 22a and the like that accommodate the power device 10a as shown in FIG. 2. In addition, the secondary molded body 22 has a fixed portion (not shown) that is fixed to the main body case 6. Moreover, in the present embodiment, the secondary molded body 22 has, for example, an exposed portion 22b, a claw portion 22c, and a fitting wall portion 22d, as shown in FIG. 2.

The exposed portion 22b is a portion in which the outer wall surface 21b of the upper wall portion 21a provided in the primary molded body 21 is exposed. That is, in the present embodiment, the secondary molded body 22 includes the primary molded body 21 so that a range of the outer wall surface 21b is mostly exposed.

As shown in FIGS. 4A and 4B, for example, the claw portion 22c is a portion locked to the outer wall surface 21b of the upper wall portion 21a provided in the primary molded body 21, and a plurality of claw portions 22c are provided. Each of the claw portions 22c is locked to the outer wall surface 21b, which is a surface of the primary molded body 21, to be in contact with the outer wall surface 21b from outside of the magnetic core 30 in the radial direction to the inside in the radial direction.

A contact area between the primary molded body 21 and the secondary molded body 22 is reduced by providing the exposed portion 22b, but the claw portion 22c is locked to the upper wall portion 21a of the primary molded body 21, and thereby a joining strength between the primary molded body 21 and the secondary molded body 22 can be held.

The fitting wall portion 22d is a wall portion arranged to fit into the groove portion 21c of the primary molded body 21. As shown in FIG. 4B, the fitting wall portion 22d is arranged in the groove portion 21c with the first end surface 33 of the magnetic core 30 exposed. Similarly, the fitting wall portion 22d is arranged in the groove portion 21c with the second end surface 34 of the magnetic core 30 exposed.

In addition, as shown in FIGS. 2 and 3, the fitting wall portion 22d is formed so as to have a width dimension from an inner wall surface on one side to an inner wall surface on the other side of the groove portion 21c. That is, the fitting wall portion 22d has a width dimension from an inner wall surface on the first end surface 33 side to an inner wall surface on the second end surface 34 side.

The contact area between the primary molded body 21 and the secondary molded body 22 is reduced by providing the exposed portion 22b, but the fitting wall portion 22d is fit into the groove portion 21c, and thereby the joining strength between the primary molded body 21 and the secondary molded body 22 can be held.

The secondary molded body 22 is formed by injection molding in which the primary molded body 21 holding the magnetic core 30 and the like is arranged inside a mold, and the molten resin is injected into the mold and cooled. That is, the power module case 10b having the primary molded body 21 and the secondary molded body 22 is formed by insert molding.

The power conversion device 1 of the present embodiment as described above includes the magnetic core 30 having the gap G formed by cutting out a part of the annular shape. In addition, the power conversion device 1 includes the resin primary molded body 21 and the resin secondary molded body 22. The primary molded body 21 covers the first end portion 31 and the second end portion 32 of the magnetic core 30 arranged opposite to each other with the gap G therebetween from the outside of the magnetic core 30 in the radial direction and holds the magnetic core 30. Moreover, the secondary molded body 22 has an exposed portion 22b in which the outer wall surface 21b of the upper wall portion 21a covering the first end portion 31 and the second end portion 32 of the primary molded body 21 is exposed and includes the primary molded body 21 therein.

In the power conversion device 1 of the present embodiment, the primary molded body 21 has the upper wall portion 21a that covers the first end portion 31 and the second end portion 32 of the magnetic core 30 from the outside of the magnetic core 30 in the radial direction. In addition, the secondary molded body 22 has the exposed portion 22b in which the secondary molded body 22 including the primary molded body 21 exposes the outer wall surface 21b of the upper wall portion 21a. For this reason, according to the power conversion device 1 of the present embodiment, when the secondary molded body 22 is formed, the molten resin does not hit the upper wall portion 21a of the primary molded body 21 covering the first end portion 31 and the second end portion 32.

Therefore, in the power conversion device 1 of the present embodiment, it is possible to prevent a pressure due to the molten resin from acting on the first end portion 31 and the second end portion 32 of the magnetic core 30. For this reason, it is possible to prevent the gap G provided between the first end portion 31 and the second end portion 32 from being deformed. Therefore, according to the power conversion device 1 of the present embodiment, in the power conversion device having the magnetic core 30 provided with the gap G, it is possible to prevent the gap G from being changed due to a resin pressure at the time of forming the secondary molded body 22.

In addition, in the power conversion device 1 of the present embodiment, the primary molded body 21 has the groove portion 21c in which the first end surface 33 exposed to the gap G of the first end portion 31 and the second end surface 34 exposed to the gap G of the second end portion 32 are exposed. According to the power conversion device 1 of the present embodiment, by inserting a hall element to the groove portion 21c, the hall element and end surfaces (the first end surface 33 and the second end surface 34) of the magnetic core 30 can be arranged close to each other without any obstacles.

In addition, in the power conversion device 1 of the present embodiment, the secondary molded body 22 has the fitting wall portion 22d from the inner wall surface on the first end surface 33 side of the groove portion 21c to the inner wall surface on the second end surface 34 side with the first end surface 33 and the second end surface 34 exposed. In the power conversion device 1 of the present embodiment, the contact area between the primary molded body 21 and the secondary molded body 22 is reduced by providing the exposed portion 22b. On the other hand, the claw portion 22c is locked to the upper wall portion 21a of the primary molded body 21, the joining strength between the primary molded body 21 and the secondary molded body 22 can be held.

Moreover, in the power conversion device 1 of the present embodiment, the secondary molded body 22 has the claw portion 22c that is locked from the outside of the magnetic core 30 in the radial direction to the inside in the radial direction on the surface of the primary molded body 21. In the power conversion device 1 of the present embodiment, the contact area between the primary molded body 21 and the secondary molded body 22 is reduced by providing the exposed portion 22b, but the fitting wall portion 22d is fit into the groove portion 21c, and thereby, the joining strength between the primary molded body 21 and the secondary molded body 22 can be held.

Moreover, the power conversion device 1 of the present embodiment has the fastening nut 50 to which the end portions of the bus bar 10c inserted inside the magnetic core 30 in the radial direction are fastened. Furthermore, the fastening nut 50 is held in the primary molded body 21 and arranged adjacent to the magnetic core 30. According to the power conversion device 1 of the present embodiment, the fastening nut 50 having higher rigidity than the primary molded body 21 is held in the primary molded body 21. For this reason, the rigidity of the primary molded body 21 near the magnetic core 30 can be reinforced by the fastening nut 50. Therefore, according to the power conversion device 1 of the present embodiment, it is possible to prevent the gap G more reliably from being changed due to the resin pressure at the time of forming the secondary molded body 22.

Second Embodiment

Next, a second embodiment of the present invention will be described with reference to FIG. 5. In the description of the present embodiment, the same parts as those in the first embodiment will be omitted or simplified.

Figure 5:
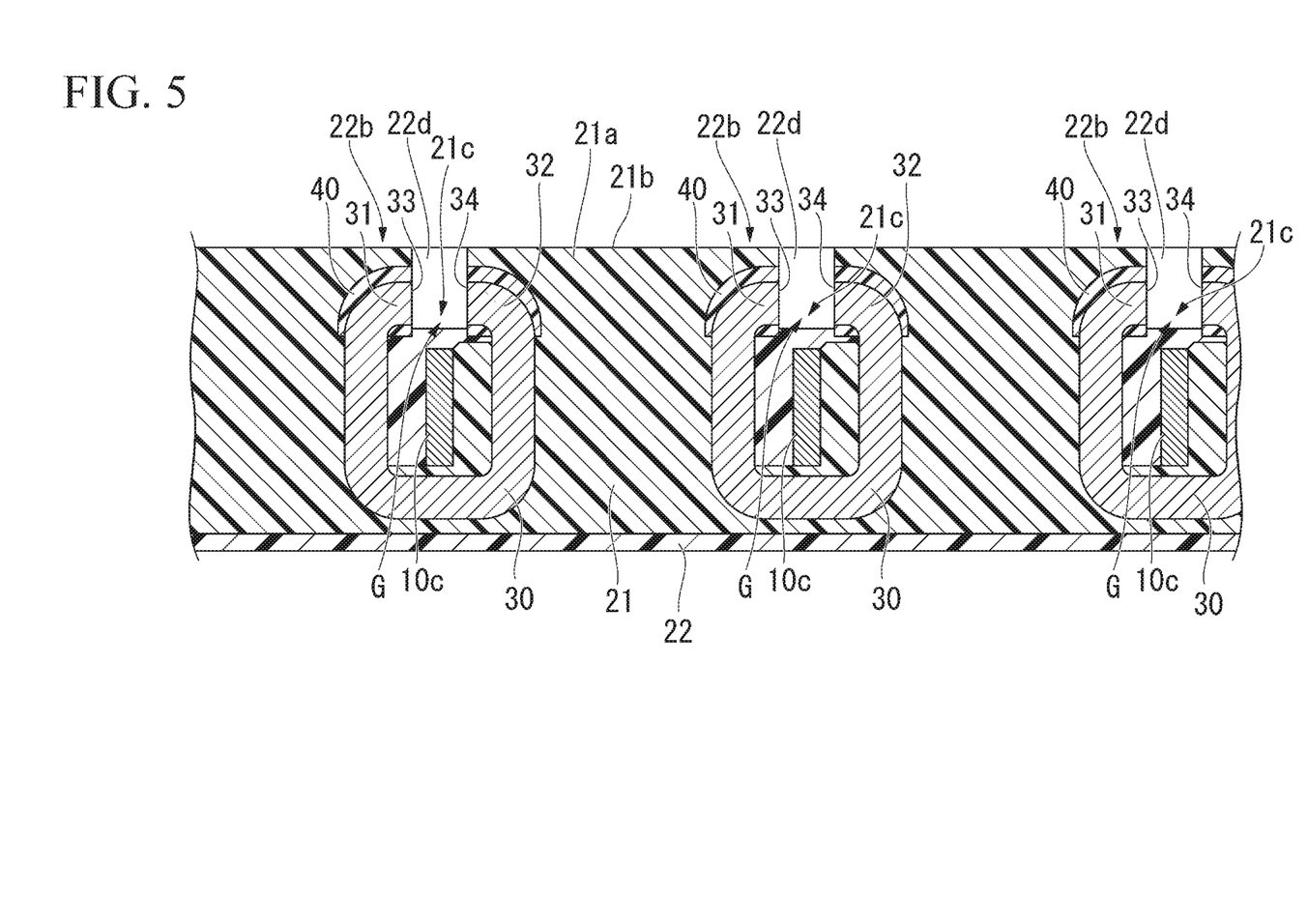
FIG. 5 is a diagram which shows a power module included in a power conversion device in a second embodiment of the present invention and is a cross-sectional view at the same position as in FIG. 3.

FIG. 5 is a cross-sectional view at the same position of the power module included in the power conversion device of the present embodiment as in FIG. 3. As shown in FIG. 5, in the power conversion device of the present embodiment, the fastening nut 50 included in the power conversion device 1 of the first embodiment is not provided.

It is also possible to adopt a configuration that does not include the fastening nut 50. Even when such a configuration is adopted, the primary molded body 21 has the upper wall portion 21a that covers the first end portion 31 and the second end portion 32 of the magnetic core 30 from the outside of the magnetic core 30 in the radial direction. In addition, the secondary molded body 22 has the exposed portion 22b in which the secondary molded body 22 including the primary molded body 21 exposes the outer wall surface 21b of the upper wall portion 21a. For this reason, according to the power conversion device of the present embodiment, similarly to the power conversion device 1 of the first embodiment, when the secondary molded body 22 is formed, the molten resin does not hit the upper wall portion 21a of the primary molded body 21 covering the first end portion 31 and the second end portion 32.

Therefore, even in the power conversion device of the present embodiment, it is possible to prevent a pressure due to a molten resin from acting on the first end portion 31 and the second end portion 32 of the magnetic core 30, and it is possible to prevent the gap G provided between the first end portion 31 and the second end portion 32 from being deformed.

Although preferred embodiments of the present invention have been described above with reference to the accompanying drawings, it is needless to say that the present invention is not limited only to the embodiments described above. Various shapes and combinations of the components shown in the embodiments described above are examples, and various changes can be made based on design requirements and the like within a range not departing from the gist of the present invention.

For example, in the embodiments described above, a configuration in which the secondary molded body 22 has the claw portion 22c and the fitting wall portion 22d has been described. However, the present invention is not limited only to this configuration. The present invention can adopt a configuration in which the secondary molded body 22 does not include one or both of the claw portion 22c and the fitting wall portion 22d.

Moreover, in the embodiments described above, a configuration that includes the reinforcing resin portion 40 has been described. By including such a reinforcing resin portion 40, it is possible to prevent the gap G of the magnetic core 30 from being deformed. However, the present invention is not limited only to this, and can adopt a configuration that does not include the reinforcing resin portion 40.

EXPLANATION OF REFERENCES

1 Power conversion device
10 Power module
10a Power device
10b Power module case
10c Bus bar
11 Circuit board
21 Primary molded body
21a Upper wall portion (part)
21b Outer wall surface (surface)
21c Groove portion
22 Secondary molded body
22a Accommodation recess
22b Exposed portion
22c Claw portion
22d Fitting wall portion
30 Magnetic core
31 First end portion
32 Second end portion
33 First end surface
34 Second end surface
40 Reinforcing resin portion
50 Fastening nut (Fastening structure)
G Gap

What is claimed is:

1. A power conversion device comprising:
a magnetic core which has a gap formed by cutting out a part of an annular shape;
a resin primary molded body configured to hold the magnetic core by covering a first end portion and a second end portion of the magnetic core that are arranged opposite to each other with the gap therebetween from outside of the magnetic core in a radial direction; and
a resin secondary molded body which has an exposed portion in which a surface of a portion of the primary molded body that covers the first end portion and the second end portion is exposed, and contains the primary molded body,
wherein the primary molded body has a groove portion in which a first end surface exposed to the gap of the first end portion and a second end surface exposed to the gap of the second end portion are exposed, and
wherein the secondary molded body has a fitting wall portion from an inner wall surface on the first end surface side of the groove portion to an inner wall surface on the second end surface side with the first end surface and the second end surface exposed.

2. A power conversion device comprising:
a magnetic core which has a gap formed by cutting out a part of an annular shape;
a resin primary molded body configured to hold the magnetic core by covering a first end portion and a second end portion of the magnetic core that are arranged opposite to each other with the gap therebetween from outside of the magnetic core in a radial direction; and
a resin secondary molded body which has an exposed portion in which a surface of a portion of the primary molded body that covers the first end portion and the second end portion is exposed, and contains the primary molded body,
wherein the primary molded body has a groove portion in which a first end surface exposed to the gap of the first end portion and a second end surface exposed to the gap of the second end portion are exposed, and
wherein the secondary molded body has a claw portion that is locked from the outside of the magnetic core in the radial direction to an inside in the radial direction on a surface of the primary molded body.

3. A power conversion device comprising:
a magnetic core which has a gap formed by cutting out a part of an annular shape;
a resin primary molded body configured to hold the magnetic core by covering a first end portion and a second end portion of the magnetic core that are arranged opposite to each other with the gap therebetween from outside of the magnetic core in a radial direction; and
a resin secondary molded body which has an exposed portion in which a surface of a portion of the primary molded body that covers the first end portion and the second end portion is exposed, and contains the primary molded body,
wherein the primary molded body has a groove portion in which a first end surface exposed to the gap of the first end portion and a second end surface exposed to the gap of the second end portion are exposed,
wherein the secondary molded body has a fitting wall portion from an inner wall surface on the first end surface side of the groove portion to an inner wall surface on the second end surface side with the first end surface and the second end surface exposed, and
wherein the secondary molded body has a claw portion that is locked from the outside of the magnetic core in the radial direction to the inside in the radial direction on the surface of the primary molded body.

4. The power conversion device according to claim 1, further comprising:
a fastening structure in which an end portion of a bus bar inserted into the inside of the magnetic core in the radial direction is fastened,
wherein the fastening structure is held in the primary molded body and arranged adjacent to the magnetic core.

5. The power conversion device according to claim 2, further comprising:
a fastening structure in which the end portion of the bus bar inserted into the inside of the magnetic core in the radial direction is fastened,
wherein the fastening structure is held in the primary molded body and arranged adjacent to the magnetic core.

6. The power conversion device according to claim 3, further comprising:
a fastening structure in which the end portion of the bus bar inserted into the inside of the magnetic core in the radial direction is fastened,
wherein the fastening structure is held in the primary molded body and arranged adjacent to the magnetic core.

* * * * *